(12) United States Patent
Park

(10) Patent No.: US 9,577,013 B2
(45) Date of Patent: Feb. 21, 2017

(54) ORGANIC LIGHT-EMITTING DIODE (OLED) DISPLAY CAPABLE OF CONTROLLING LIGHT TRANSMITTANCE

(71) Applicant: Samsung Display Co., Ltd., Yongin, Gyeonggi-Do (KR)

(72) Inventor: Soo-Ran Park, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/226,635

(22) Filed: Mar. 26, 2014

(65) Prior Publication Data
US 2015/0144891 A1 May 28, 2015

(30) Foreign Application Priority Data
Nov. 28, 2013 (KR) ........................ 10-2013-0146450

(51) Int. Cl.
*H01L 29/08* (2006.01)
*H01L 27/32* (2006.01)
*H01L 51/52* (2006.01)

(52) U.S. Cl.
CPC ......... *H01L 27/3246* (2013.01); *H01L 27/326* (2013.01); *H01L 27/3232* (2013.01); *H01L 51/5206* (2013.01); *H01L 51/5218* (2013.01); *H01L 51/5221* (2013.01); *H01L 51/5234* (2013.01); *H01L 51/5284* (2013.01)

(58) Field of Classification Search
CPC ...... H01L 33/16; H01L 33/60; H01L 51/5221; H01L 51/5206; H01L 51/5234; H01L 51/5281; H01L 51/5284; H01L 51/5293; H01L 2001/133618
See application file for complete search history.

(56) References Cited

U.S. PATENT DOCUMENTS 8,059,328 B1 * 11/2011 Kuo ..................... G02B 26/005
359/290
2007/0057932 A1    3/2007 Shin et al.
(Continued)

FOREIGN PATENT DOCUMENTS

KR    10-2007-0030619 A    3/2007
KR    10-2011-0110590 A    10/2011
(Continued)

*Primary Examiner* — Daniel Luke
*Assistant Examiner* — Khatib Rahman
(74) *Attorney, Agent, or Firm* — Knobbe, Martens, Olson & Bear, LLP

(57) ABSTRACT

An organic light-emitting diode (OLED) display capable of controlling light transmittance is disclosed. In one aspect, the OLED display includes a plurality of pixels, each including a first region configured to emit light and a second region configured to transmit light therethrough and a plurality of first electrodes respectively formed in the first regions of the pixels. The OLED display also includes a plurality of organic layers respectively formed over the first electrodes, a second electrode formed over all of the organic layers, and a plurality of third electrodes each formed in the second regions of the pixels. The OLED display further includes a plurality of solvents respectively placed over the third electrodes, wherein each of the solvents is configured to selectively block light and a fourth electrode formed over the solvents for all of the pixels.

16 Claims, 13 Drawing Sheets

(56) References Cited

U.S. PATENT DOCUMENTS

| | | | |
|---|---|---|---|
| 2011/0227080 A1* | 9/2011 | Roh | G02F 1/167 |
| | | | 257/59 |
| 2011/0249211 A1 | 10/2011 | Song et al. | |
| 2012/0080680 A1* | 4/2012 | Choi et al. | 257/59 |
| 2012/0243070 A1* | 9/2012 | Kuhlman | G02B 26/005 |
| | | | 359/290 |
| 2012/0327331 A1* | 12/2012 | Yim | G02F 1/1362 |
| | | | 349/62 |
| 2013/0194167 A1 | 8/2013 | Yun et al. | |
| 2014/0225815 A1 | 8/2014 | Jung et al. | |

FOREIGN PATENT DOCUMENTS

| | | |
|---|---|---|
| KR | 10-2013-0071543 A | 7/2013 |
| KR | 10-2013-0088686 A | 8/2013 |
| KR | 10-2014-0101606 A | 8/2014 |

\* cited by examiner

ORGANIC LIGHT-EMITTING DIODE (OLED) DISPLAY CAPABLE OF CONTROLLING LIGHT TRANSMITTANCE

CROSS-REFERENCE TO RELATED APPLICATIONS

This application claims the benefit of Korean Patent Application No. 10-2013-0146450, filed on Nov. 28, 2013, in the Korean Intellectual Property Office, the disclosure of which is incorporated herein in its entirety by reference.

BACKGROUND

Field

The described technology generally relates to an organic light-emitting diode (OLED) display.

Description of the Related Technology

Due to their favorable characteristics such as excellent viewing angles, high contrast, fast response speeds, low power consumption, and other characteristics, OLED displays are widely used in consumer electronic devices including MP3 players, mobile phones, TVs, etc. OLED displays are self-emissive and do not require a separate light source, unlike liquid crystal displays (LCDs). Therefore, the thickness and weight of OLED displays can be reduced when compared with LCDs. In addition, OLED displays can include a transmission region (or a transmission window) that is formed separately from the regions in which a transparent thin film transistor (TFT) or a transparent OLED are formed. OLED displays including such transmission regions can appear transparent, allowing light from an external source to pass therethough.

SUMMARY OF CERTAIN INVENTIVE ASPECTS

One inventive aspect is an OLED display for controlling external light transmittance.

Another aspect is an OLED display for controlling light transmittance, the display including a plurality of pixels, each of pixels including a first region that emits light and a second region that transmits external light, a plurality of first electrodes that are independently formed in the first region of each of the plurality of pixels, an organic layer that is formed on the plurality of first electrodes and includes an organic emission layer, a second electrode that covers the organic layer and is formed above and connected to the plurality of pixels, a plurality of third electrodes that are independently formed in the second region of each of the plurality of pixels, a solvent that is placed on the third electrode, blocks light, and adjusts a light blocking area according to an electric field, and a fourth electrode that covers the solvent and is formed above and connected to the plurality of pixels.

A plurality of thin film transistors (TFTs) that are formed in the first region of each of the plurality of pixels and at least one insulating layer that covers the plurality of TFTs are further included. A transmission window may be provided in the at least one layer disposed at a location that corresponds to a location of the second region and the solvent may be disposed in the transmission window.

The first electrode may be a light reflecting electrode and the third electrode may be a light transmitting electrode.

The first region may include a circuit including a thin film transistor (TFT) and an emission area including one of the plurality of first electrodes. The circuit region and the emission area may overlap each other.

The fourth and second electrodes may be integrally formed.

The first and third electrodes may be light transmitting electrodes.

The first region may include a circuit including a thin film transistor (TFT) and an emission area including the one of plurality of first electrodes. The circuit region and the emission area may be adjacent to each other.

The fourth and second electrodes may be separately formed.

The third electrode may be independently provided in each of the plurality of pixels.

The third electrode may be connected to at least two pixels that are adjacent to each other.

When an electric field is generated by the first and second electrodes, an electric field may not be generated by the third and fourth electrodes and when an electric field is not generated by the first and second electrodes, an electric field may be generated by the third and fourth electrodes.

When the electric field is not generated by the third and fourth electrodes, the light blocking area of the solvent may be the largest. When the electric field is not generated by the third and fourth electrodes, the light blocking area of the solvent may be the smallest.

The solvent may be black oil.

A surface of the third electrode and a surface of the fourth electrode which come in contact with the black oil may be hydrophobic.

Another aspect is an OLED display including a plurality of pixels, each pixel including a first region that emits light and a second region that at least partially transmits light therethrough, a plurality of first electrodes respectively formed in the first regions of the pixels, a plurality of organic layers respectively formed over the first electrodes, a second electrode formed over all of the organic layers, a plurality of third electrodes each corresponding to at least one of the pixels, wherein each of the third electrodes is formed in the second region of the at least one corresponding pixel, a plurality of solvents respectively placed over the third electrodes, wherein each of the solvents selectively blocks light based at least in part on an electric field, and a fourth electrode formed over the solvents for all of the pixels.

The OLED display further includes a plurality of TFTs each formed in the first region of a corresponding pixel and at least one insulating layer formed over the TFTs, wherein a transmission opening is formed in the insulating layer in the second region of each of the pixels and wherein the solvents are placed in the transmission openings. The first electrode is a light reflecting electrode and the third electrode is a light transmitting electrode. The first region of each of the pixels includes a circuit including a TFT and an emission area including the corresponding first electrode, wherein the circuit region and the emission area substantially overlap each other. The fourth and second electrodes are integrally formed. The first and third electrodes are light transmitting electrodes.

The first region of each of the pixels includes a circuit including a TFT and an emission area including the corresponding first electrode and wherein the circuit region and the emission area are adjacent to each other. The fourth and second electrodes are separately formed. Each of the third electrodes corresponds to one of the pixels. Each of the third electrodes corresponds to at least two adjacent pixels. The OLED display is further configured to respectively generate electric fields between the first and second electrodes and between the third and fourth electrodes, wherein when the OLED display generates the electric field between the first and second electrodes, the OLED display does not generate the electric field between the third and fourth electrodes and wherein when the OLED display does not generate the electric field between the first and second electrodes, the OLED display generates the electric field between the third and fourth electrodes.

When the electric field is not generated between the third and fourth electrodes, a light blocking area of each of the solvents is at a maximum and when the electric field is generated by the third and fourth electrodes, the light blocking area of each of the solvents is at a minimum. Each of the solvents includes black oil. A surface of each of the third electrodes and a surface of the fourth electrode which contact the black oil are hydrophobic.

Another aspect is an OLED display including a plurality of pixels, each including a plurality of subpixels, wherein each of the subpixels includes a first region configured to emit light, a second region configured to selectively transmit light therethrough, and an OLED formed in the first region, wherein each of the pixels includes at least one transmission adjusting device formed in the second regions of the corresponding subpixels and configured to adjust the transmittance of light therethrough, Each of the OLEDs includes a first electrode, an organic layer formed over the first electrode, and a second electrode formed over the organic layer of each of the subpixels. each of the transmission adjusting devices includes a third electrode, a solvent placed over the third electrode, wherein the solvent is configured to selectively block light based at least in part on an electric field, and a fourth electrode formed over the solvent of each of the subpixels.

The OLED display further includes at least one insulating layer and a pixel defining layer, wherein a plurality of openings are formed in the insulating layer and the pixel defining layer corresponding to each of the transmission adjusting devices and wherein the solvent of each of the transmission adjusting devices is placed in the corresponding opening. Each of the transmission adjusting devices is configured to change the location of the solvent. The OELD display further includes a plurality of signal lines, wherein each of the subpixels further includes at least one TFT and a capacitor, wherein each of the signal lines, the TFT and the capacitor does not overlap the second regions. The TFT and the capacitor of each of the subpixels at least partially overlap the corresponding OLED.

DETAILED DESCRIPTION OF CERTAIN INVENTIVE EMBODIMENTS

Figure 1:
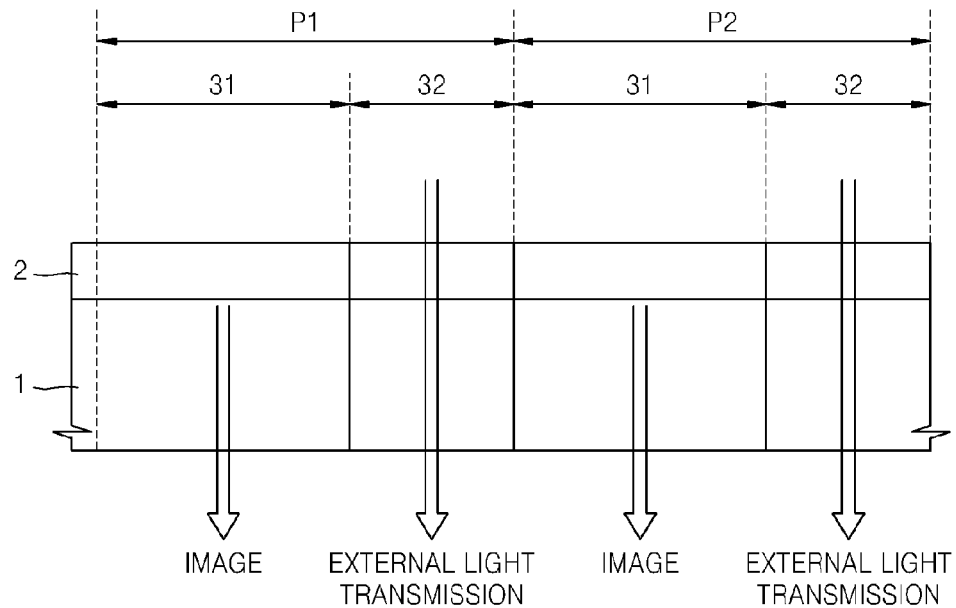
FIG. 1 is a schematic cross-sectional view of an OLED display according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the described technology. As used herein, the term "and/or" includes any and all combinations of one or more of the associated listed items. Expressions such as "at least one of," when preceding a list of elements, modify the entire list of elements and do not modify the individual elements of the list.

FIG. 1 is a schematic cross-sectional view of an organic light-emitting diode (OLED) display according to an embodiment.

Referring to FIG. 1, the OLED display includes a substrate 1 and a display unit 2 provided on the substrate 1. External light incident to the display unit 2 can penetrate through the display unit 2 to reach the substrate 1 so that a user located at an image forming side may view an image on an upper exterior side of the substrate 1. According to the embodiment illustrated in FIG. 1, the OLED display is a bottom emission type display in which an image of the display unit 2 is emitted toward the substrate 1. However, the described technology is not limited thereto.

Figure 2:
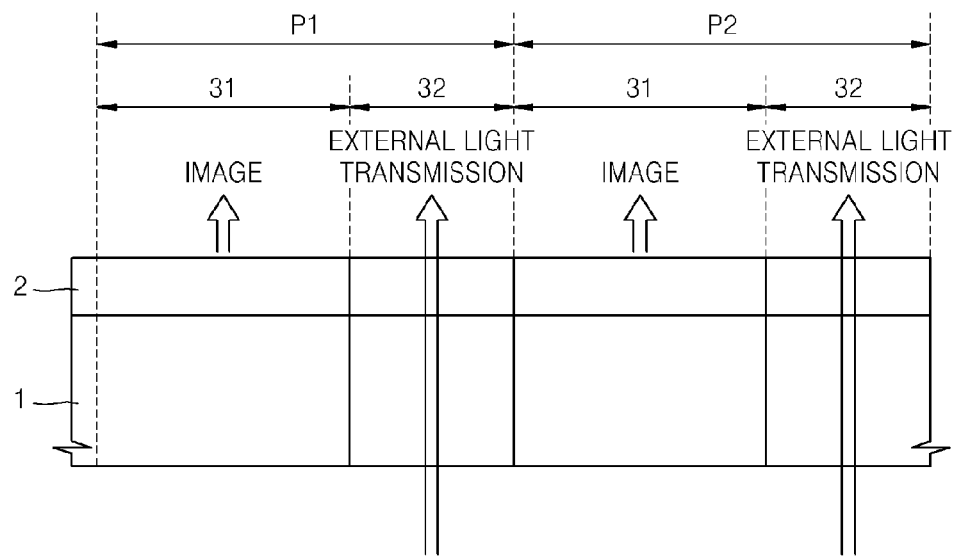
FIGS. 2 and 3 are schematic cross-sectional views of embodiments of the OLED display of FIG. 1.
Figure 3:
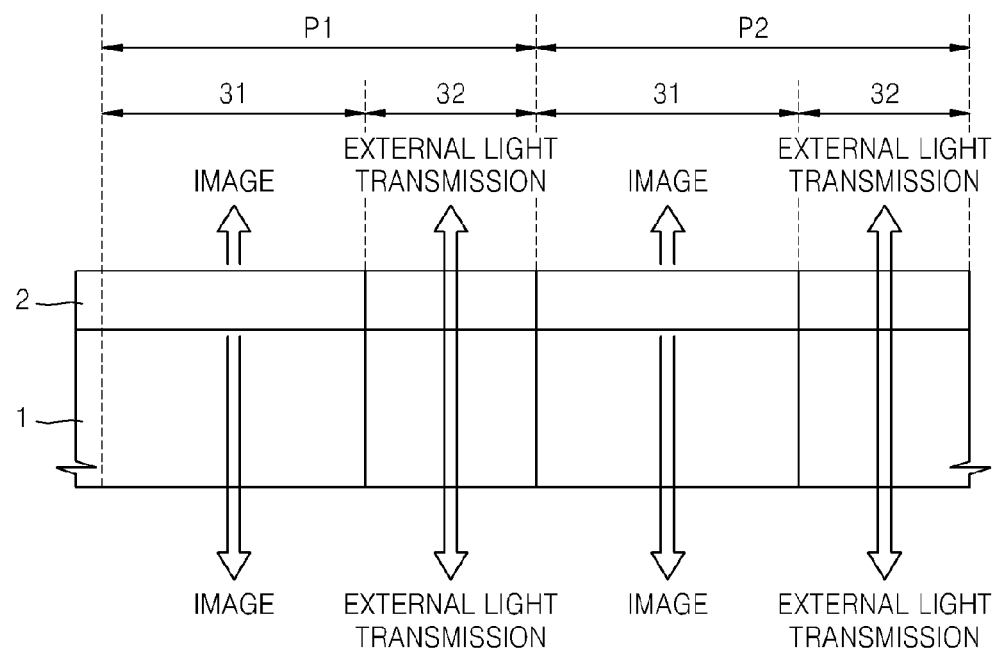

FIGS. 2 and 3 are schematic cross-sectional views of embodiments of the OLED display of FIG. 1.

In the embodiment of FIG. 2, the OLED display is a top emission display so that the images displayed on the display unit 2 are emitted in the opposite direction of the substrate 1. The user may view the image of the display unit 2 from an upper side of the substrate 1 or an image on a lower exterior side. Alternatively, in the embodiment of FIG. 3, the OLED display is a dual side emission display so that the image of the display unit 2 is emitted toward the substrate 1 and in the opposite direction away from the substrate 1.

As illustrated in FIGS. 1 to 3, a first pixel P1 and a second pixel P2 of the OLED display are adjacent to each other.

Each of the first and second pixels P1 and P2 include a first region 31 and second region 32. In the first region 31, the image is emitted from the display unit 2, and the second region 32 transmits external light. Accordingly, when the user is not watching the image displayed on the display unit 2, the user may view an external image.

In some embodiments, no components of the display such as a thin film transistor (TFT), a capacitor, or an OLED are located in the second region 32 so that the external light transmittance of the second region 32 increases. Accordingly, the external light transmittance of the display unit 2 may be increased and an image transmitted by the external light can be prevented from being distorted due to the components such as the TFT, the capacitor, and the OLED.

Figure 4:
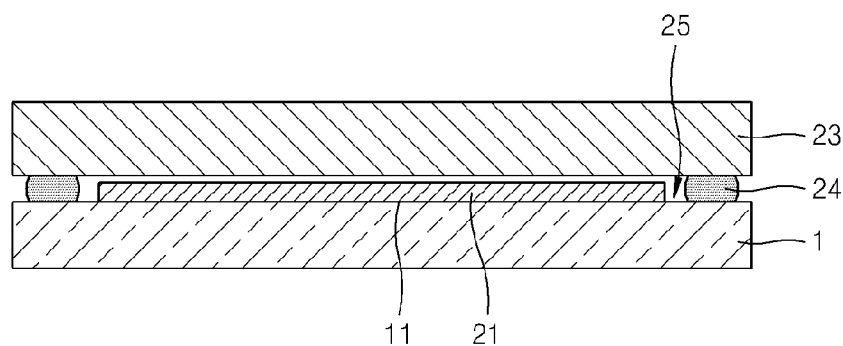
FIG. 4 is a detailed cross-sectional view of an embodiment of FIGS. 1 to 3.

FIG. 4 is a detailed cross-sectional view of an embodiment of FIGS. 1 to 3. Referring to FIG. 4, the display unit 2 includes an organic emission unit 21 formed on a first surface 11 of the substrate 1 and an encapsulating substrate 23 that encapsulates the organic emission unit 21.

The encapsulating substrate 23 can be formed of a transparent material so that an image may be emitted from the organic emission unit 21. The encapsulating substrate 23 can substantially block external air and moisture from penetrating into the organic emission unit 21. Edges of the substrate 1 and the encapsulating substrate 23 are bonded by using an encapsulant 24 so as to encapsulate a space 25 between the substrate 1 and the encapsulating substrate 23. A moisture absorbant or a filler may be filled in the space 25.

Figure 5:
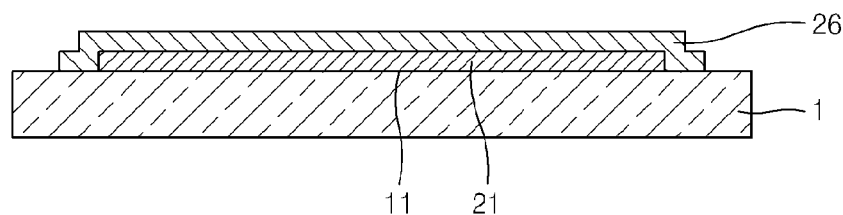
FIG. 5 is a detailed cross-sectional view of another embodiment of FIGS. 1 to 3.

FIG. 5 is a detailed cross-sectional view of another embodiment of FIGS. 1 to 3.

As illustrated in FIG. 5, instead of the encapsulating substrate 23, an encapsulating film 26 may be formed on the organic emission unit 21 by using a thin film so as to protect the organic emission unit 21 from the external environment. The encapsulating film 26 may have a stacked structure including a layer formed of an inorganic material such as silicon oxide or silicon nitride and a layer formed of an organic material such as epoxy or polyimide. However, the encapsulating film 26 is not limited thereto and may have any structure including a transparent thin film. Although not illustrated, the organic emission unit 21 may be encapsulated by additionally forming the encapsulating substrate 23 of FIG. 4 on the encapsulating film 26 of FIG. 5.

Hereinafter, the organic emission unit 21 will be described.

Figure 6:
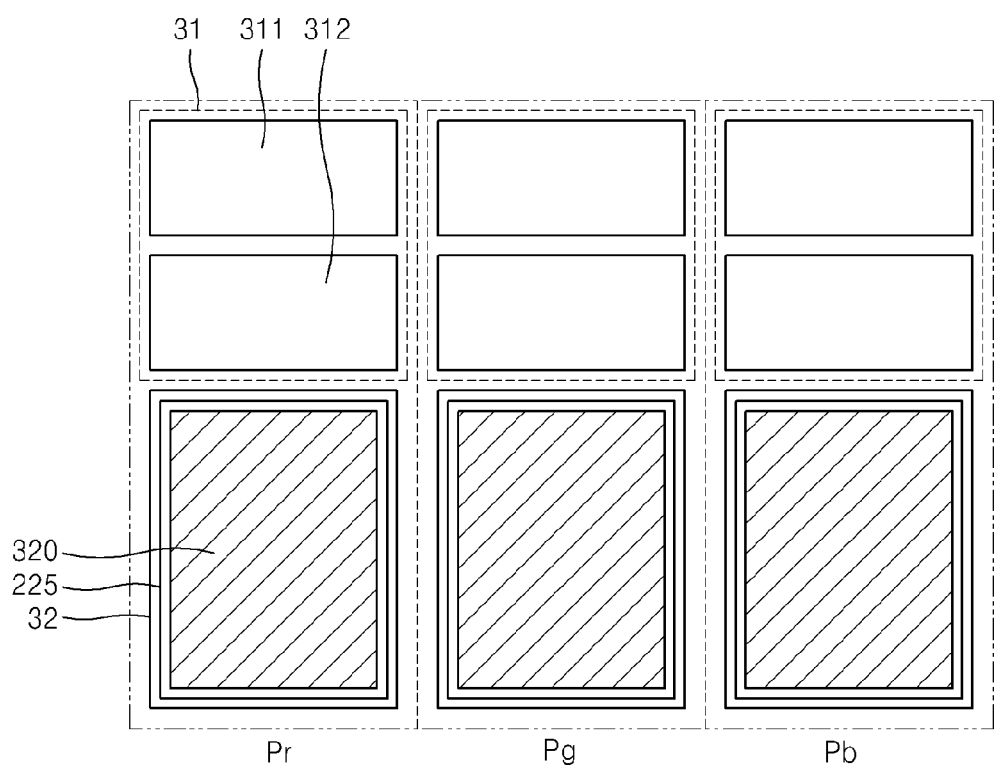
FIG. 6 is a schematic plan view of the organic emission unit of FIG. 4 or 5 according to an embodiment.

FIG. 6 is a schematic plan view of the organic emission unit 21 of FIGS. 4 and 5 according to an embodiment. FIG. 6 illustrates a red pixel Pr, a green pixel Pg, and a blue pixel Pb of the organic emission unit 21, which are adjacent to each other.

The red, green, and blue pixels Pr, Pg, and Pb each include a circuit area 311 and an emission area 312 in the first region 31. The circuit area 311 and the emission area 312 are formed to overlap each other. The second region 32 is formed near the first region 31 and transmits external light.

Figure 7:
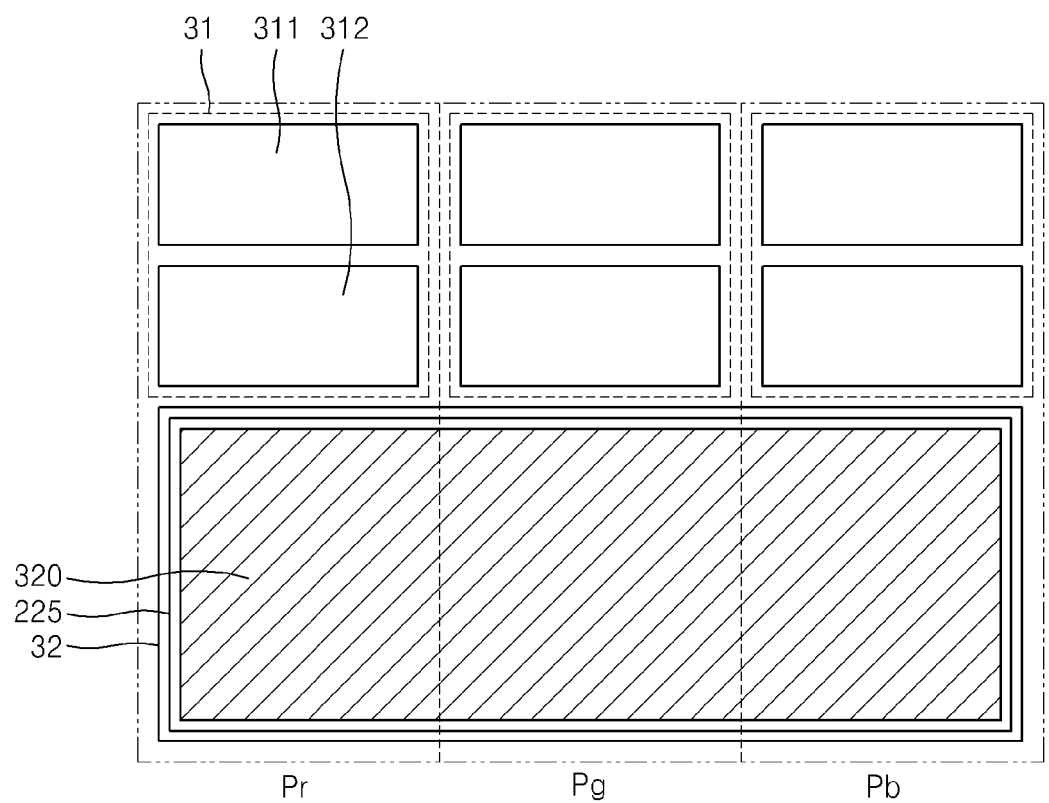
FIG. 7 is a schematic plan view of the organic emission unit of FIG. 4 or 5 according to another embodiment.

As illustrated in FIG. 6, the second region 32 may be separately provided for each of the red, green, and blue pixels Pr, Pg, and Pb. However, as illustrated in FIG. 7, the second region 32 may be formed above and connected to the red, green, and blue pixels Pr, Pg, and Pb. According to the embodiment illustrated in FIG. 7, the size of the second region 32, through which external light is transmitted, is relatively larger than the embodiment of FIG. 6, and thus, the transmittance of the display unit 2 may be increased.

Although in FIG. 7, it is illustrated that the second region 32 of the red, green, and blue pixels Pr, Pg, and Pb is connected, the described technology is not limited thereto. In other embodiments, the second region 32 of any two adjacent pixels among the red, green, and blue pixels Pr, Pg, and Pb are connected.

According to an embodiment, a transmission adjusting device 320 is provided in the second region 32. The transmission adjusting device 320 is a device that can allow or block the passage of external light through the second region 32 based on a predetermined mode of operation. When the second region 32 is separately provided for each of the red, green, and blue pixels Pr, Pg, and Pb as in FIG. 6, the transmission adjusting device 320 may also be separately provided for each of the red, green, and blue pixels Pr, Pg, and Pb, like the second region 32. However, when the second region 32 is formed above and connected to the red, green, and blue pixels Pr, Pg, and Pb as in FIG. 7, the transmission adjusting device 320 may also be formed above and connected to the red, green, and blue pixels Pr, Pg, and Pb, like the second region 32.

Figure 8:
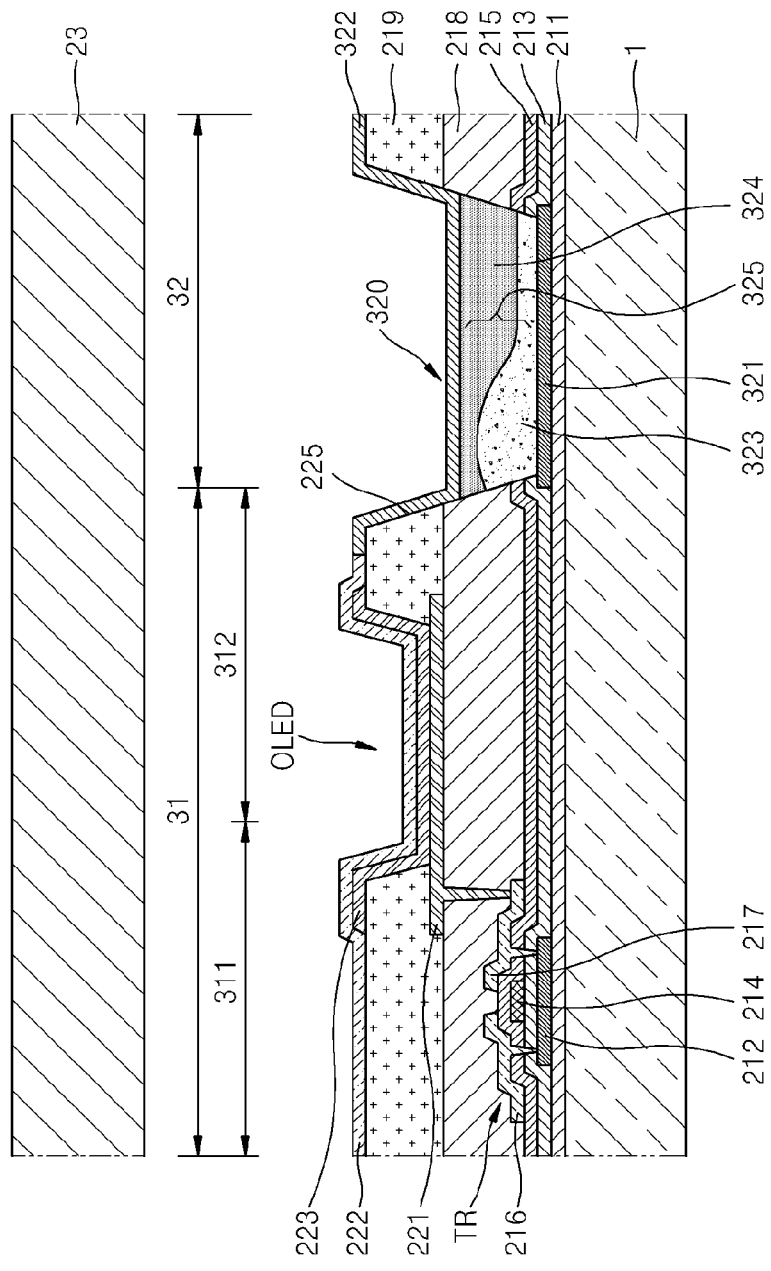
FIG. 8 is a cross-sectional view of a pixel of the organic emission unit of FIG. 4 or 5.

FIG. 8 is a cross-sectional view of a pixel among the red, green, and blue pixels Pr, Pg, and Pb of FIG. 6 or 7.

As illustrated in FIG. 8, a TFT TR is formed in the circuit area 311, however, the circuit area is not limited to including only one TFT TR. A pixel circuit PC including the TFT TR may be provided. The pixel circuit PC may further include a plurality of TFTs, a storage capacitor, and various wirings such as scan lines, data lines, and Vdd lines which are connected to the TFTs and the storage capacitor.

An OLED is formed in the emission area 312. The OLED is electrically connected to the TFT TR of the pixel circuit PC.

A buffer layer 211 is formed on the substrate 1 and the pixel circuit PC including the TFT TR is formed on the buffer layer 211.

First, a semiconductor active layer 212 is formed on the buffer layer 211.

The buffer layer 211 is formed of a transparent insulating material. The buffer layer 211 prevents impurities from penetrating into the display unit 2 and planarizes the surface of the substrate 1. Accordingly, the buffer layer 211 may be formed of various materials capable of performing these functions. For example, the buffer layer 211 may be formed of an inorganic material such as silicon oxide, silicon nitride, silicon oxynitride, aluminum oxide, aluminum nitride, titanium oxide, or titanium nitride; an organic material such as polyimide, polyester, or acryl; or have a stacked structure including the inorganic material and the organic material. The buffer layer 211 is not an essential element, and thus can be excluded from the OLED display if necessary.

The semiconductor active layer 212 may be formed of polycrystalline silicon, but is not limited thereto, and may be formed of oxide semiconductor. For example, the semiconductor active layer 212 may be a I-G-Z—O layer [an $(In_2O_3)a(Ga_2O_3)b(ZnO)c$ layer] (where a, b, and c are real numbers that respectively satisfy a≥0, b≥0, and c>0). When the semiconductor active layer 212 is formed of an oxide semiconductor, the light transmittance in the circuit area 311 of the first region 31 increases. Accordingly, the external light transmittance of the display unit 2 may be increased.

A gate insulating layer 213 is formed on the buffer layer 211 by using a transparent insulating material, so as to cover the semiconductor active layer 212. A gate electrode 214 is formed on the gate insulating layer 213.

An interlayer insulating layer 215 is formed on the gate insulating layer 213 by using a transparent insulating material so as to cover the gate electrode 214. A source electrode 216 and a drain electrode 217 are formed on the interlayer insulating layer 215 and contact the semiconductor active layer 212 via contact holes.

The TFT TR is not limited to the above described structure and may have various other structures.

A passivation layer 218 is formed to cover the pixel circuit PC including the TFT TR. The passivation layer 218 may be a single insulating layer or a plurality of insulating layers having a planarized top surface. The passivation layer 218 may be formed of a transparent inorganic and/or organic insulating material. The passivation layer 218 may be formed above and connected to all pixels.

As illustrated in FIG. 8, a first electrode 221 of the OLED is formed on the passivation layer 218 and is electrically connected to the TFT TR. The first electrode 221 is formed as an island that is separated and independent in each pixel.

A pixel-defining layer (PDL) 219 is formed on the passivation layer 218 by using an organic and/or inorganic insulating material.

The PDL 219 may be formed such that an edge of the first electrode 221 is covered and the center of the first electrode 221 is exposed. The PDL 219 may cover the first region 31 but not such that the first region 31 is entirely covered. The PDL 219 may cover at least a portion, particularly, the edge of the first electrode 221.

An organic layer 223 and a second electrode 222 are sequentially stacked on the first electrode 221. The second electrode 222 covers the organic layer 223 and the PDL 219 and is formed above and electrically connected to all pixels.

The organic layer 223 may be formed by using a low-molecular weight or polymer organic material. When the organic layer 223 is formed by using the low-molecular weight organic material, the organic layer 223 includes an emission layer (EML). Alternatively, the organic layer 223 includes the EML and may further include at least one of a hole injection layer (HIL), a hole transport layer (HTL), an electron transport layer (ETL), and an electron injection layer (EIL). The organic layer 223 may be formed by using various organic materials such as copper phthalocyanine (CuPc), N,N'-Di(naphthalene-1-yl)-N,N'-diphenyl-benzidine (NPB), or tris-8-hydroxyquinoline aluminum (Alq3). The low-molecular weight organic material may be formed by using a vacuum deposition method. Here, the HIL, the HTL, the ETL, and the EIL are common layers that may be commonly applied to the red, green, and blue pixels Pr, Pg, and Pb.

The first electrode 221 may function as an anode electrode and the second electrode 222 may function as a cathode electrode, or vice versa.

According to at least one embodiment, the first electrode 221 is a transparent electrode and the second electrode 222 is a reflective electrode. The first electrode 221 may include TTO, IZO, ZnO, or $In_2O_3$, which has a high work function. Also, the second electrode 222 may be densely formed by using metal having a low work function, that is, silver (Ag), magnesium (Mg), aluminum (Al), platinum (Pt), palladium (Pd), gold (Au), nickel (Ni), neodymium (Nd), iridium (Jr), chromium (Cr), lithium (Li), or calcium (Ca). Thus, in these embodiments, the OLED is a bottom emission type that emits images toward the first electrode 221.

However, the described technology is not limited thereto and the second electrode 222 may also be a transparent electrode.

As described above, the passivation layer 218, the gate insulating layer 213, the interlayer insulating layer 215, and the PDL 219 may be formed by using transparent insulating film so that light transmittance may be increased.

The encapsulating substrate 23 is formed on an upper side of the second electrode 222. In the FIG. 4 embodiment, the encapsulating substrate 23 is bonded to the substrate 1 by using the encapsulant 24 at an outer region of the display unit 2, so that the display unit 2 can be protected from the external environment. A filler (not shown) or a moisture absorbant (not shown) may be provided in the space between the encapsulating substrate 23 and the second electrode 222. The structure of encapsulating the display unit 2 is not limited to a structure formed by using the encapsulating substrate 23 as in FIG. 8 and may be a structure formed by using an encapsulating film as described with reference to FIG. 5.

According to the embodiment of FIG. 8, a transmission window or transmission opening 225 is formed in at least one of the PDL 219, the passivation layer 218, the interlayer insulating layer 215, the gate insulating layer 213, and the buffer layer 211. The transmission window 225 is formed by removing a portion of the aforementioned insulating layers that corresponds to the second region 32. Two or more transmission windows 225 may be formed such that they overlap each other.

The transmission window 225 may be formed as an island pattern. In the embodiment of FIG. 6, the transmission window 225 is separately provided for each of the red, green, and blue pixels Pr, Pg, and Pb. Alternately, in the embodiment of FIG. 7, the transmission window 225 is formed above and connected to the red, green, and blue pixels Pr, Pg, and Pb. FIG. 7 illustrates that the transmission window 225 is formed above and connected to the red, green, and blue pixels Pr, Pg, and Pb. However, the described technology is not limited thereto, and the transmission window 225 may be disposed above and connected to any two adjacent pixels among the red, green, and blue pixels Pr, Pg, and Pb.

According to at least one embodiment, as illustrated in FIGS. 6 and 7, the transmission adjusting device 320 is provided in the second region 32. The transmission adjusting device 320 includes a third electrode 321 and a fourth electrode 322, which face each other, and solvents are provided between the third and fourth electrodes 321 and 322.

The third electrode 321 is provided in the second region 32. Referring to FIG. 8, the third electrode 321 is provided on the buffer layer 211 and the transmission window 225 is provided such that the gate insulating layer 213, the interlayer insulating layer 215, the passivation layer 218, and the PDL 219 cover an edge of the third electrode 321 and expose the center of the third electrode 321. However, the described technology is not limited thereto. When the transmission window 225 is provided only in the passivation layer 218 and the PDL 219, the third electrode 321 is provided on the interlayer insulating layer 215. When the transmission window 225 is provided only in the PDL 219, the third electrode 321 is provided on the passivation layer 218. The third electrode 321 may be provided at various locations depending on a location of the transmission window 225.

The third electrode 321 is provided as a transparent electrode. For example, the third electrode 321 may be formed by using a transparent conductive oxide material, such as ITO, IZO, ZnO, or $In_2O_3$. The transmission adjusting device 320 needs to have a high light transmittance so as to be capable of adjusting the external light transmittance over as large a range as possible. Accordingly, the third electrode 321 is formed by using a transparent material having a high light transmittance.

The third electrode 321 may be formed as an island that is separated and independent in each pixel, but is not limited thereto, and may be formed above and connected to all pixels or all subpixels included in a pixel. When the third electrode 321 is formed above and connected to all pixels, the third electrode 321 may be a line electrode that traverses the second region 32 of pixels that are located at a single row. When the third electrode 321 is formed as an island, a switching TFT or a bridge electrode may be connected to each of the third electrode 321. The third electrode 321 may receive a voltage or a signal for turning on/off the transmission adjusting device 320, directly or via the switching TFT or the bridge electrode. The voltage or a signal applied to the first electrode 221 is not the same as that applied to the third electrode 321.

The fourth electrode 322 is provided to face the third electrode 321. The fourth electrode 322 is provided such that a cavity 325 of a predetermined size is formed between the third and the fourth electrodes 321 and 322. The fourth electrode 322 is formed above and connected to a plurality of pixels. In a bottom emission type display, since the second electrode 222 is a reflective electrode, the fourth electrode 322 is formed not integrally, but separately from the second electrode 222. The fourth electrode 322 is formed as a semi-transparent electrode through which light may be transmitted or as a transparent electrode. For example, the fourth electrode 322 may be formed as a thin film metal layer using Ag, Mg, Al, Pt, Pd, Au, Ni, Nd, Jr, Cr, Li, or Ca, or formed by using a transparent conductive oxide material such as ITO, IZO, ZnO, or $In_2O_3$. However, the fourth electrode 322 may be electrically connected to the second electrode 222.

A first solvent 323 and a second solvent 324 are provided in the cavity 325 formed between the third and fourth electrodes 321 and 322. The first solvent 323 is a solvent that may block light and the light blocking area thereof is adjusted according to an electric field. That is, the first solvent 323 is a solvent that has an electrowetting property and a contact angle formed with respect to the third electrode 321 changes according to the applied electric field. For example, the first solvent 323 may be black oil, but is not limited thereto, and may be a solvent having a unique color, or a solvent including particles such as carbon (C) or titanium oxide ($TiO_2$) which may block light.

The second solvent 324 may be formed by using a material that is not mixed with the first solvent 323. For example, if the first solvent 323 is hydrophobic, the second solvent 324 may be hydrophilic. As another example, if the first solvent 323 is non-polarized, the second solvent 324 may be polarized. The second solvent 324 may fill the cavity 325 formed between the third and fourth electrodes 321 and 322 so that the cavity 325 is maintained and block impurities from flowing in.

In some embodiments, the first solvent 323 is hydrophobic or non-polarized, for example, block oil. In these embodiments, an insulating water repellent layer is formed at the surface of the third electrode 321 that contacts the first solvent 323, or processed so that the surface is hydrophobic. Alternatively, the surface of the fourth electrode 322 that faces the surface of the third electrode 321 may be processed so that the surface of the fourth electrode 322 is hydrophobic. Accordingly, the first solvent 323 is prevented from being attached to the surface of the third electrode 321 or the surface of the fourth electrode 322.

When an electric field is not applied between the third and fourth electrodes 321 and 322, the first solvent 323 contacts a large area of the surface of the third electrode 321. That is, the first solvent 323 has a low contact angle with respect to the surface of the third electrode 321. However, when an electric field is applied between the third and fourth electrodes 321 and 322, the first solvent 323 contracts, and thus, the first solvent 323 contacts a small area of the surface of the third electrode 321. That is, the first solvent 323 has a high contact angle with respect to the surface of the third electrode 321. Therefore, when the electric field is not applied between the third and fourth electrodes 321 and 322, the first solvent 323 has the largest light blocking area i.e. a maximum area, and thus blocks external light from being transmitted to the second region 32. When the electric field is applied between the third and fourth electrodes 321 and 322, the first solvent 323 has the smallest light blocking area, i.e. a minimum area, and thus allows external light to be transmitted to the second region 32.

Hereinafter, in relation to related to operations of the OLED, operations of the transmission adjusting device 320 will be described with reference to FIGS. 9 and 10.

Figure 9:
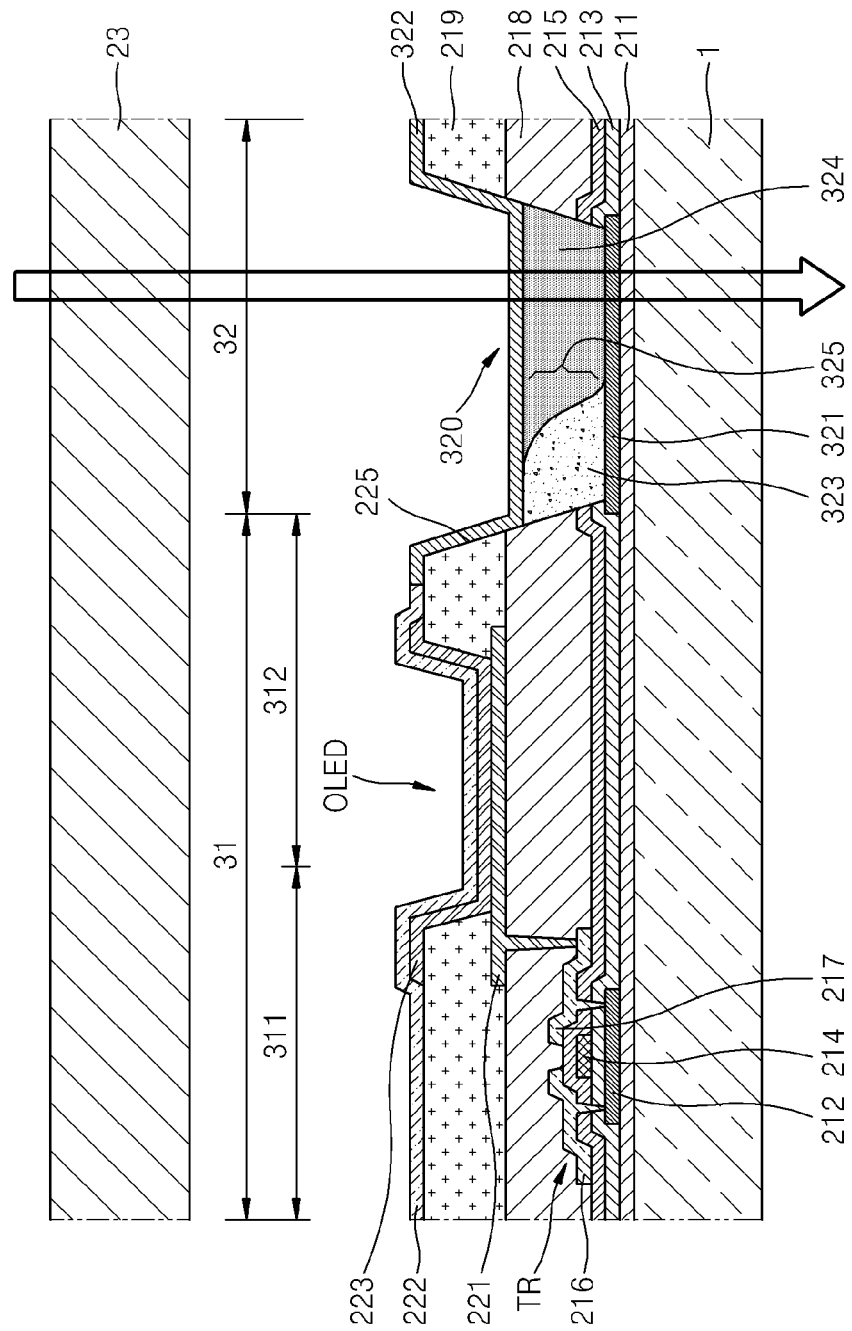
FIGS. 9 and 10 are cross-sectional views showing the operation of the organic emission unit of FIG. 4 or 5.

FIG. 9 illustrates a non-emission mode of the OLED. When the OLED is not emitting light, the OLED display needs to be shown as a transparent display that transmits external light. Thus, the transmission adjusting device 320 needs to be in a state that transmits external light. That is, a voltage is not applied to the first electrode 221 for driving the OLED, but is applied to the third electrode 321 for driving the transmission adjusting device 320. When the OLED display is powered on, a low voltage or a base voltage is applied to the second and fourth electrodes 222 and 322.

When the voltage is applied to the third electrode 321, an electric field is generated between the third and fourth electrodes 321 and 322, and the first solvent 323 contracts so that the light blocking area is reduced. Therefore, the transmission adjusting device 320 may transmit external light.

Figure 10:
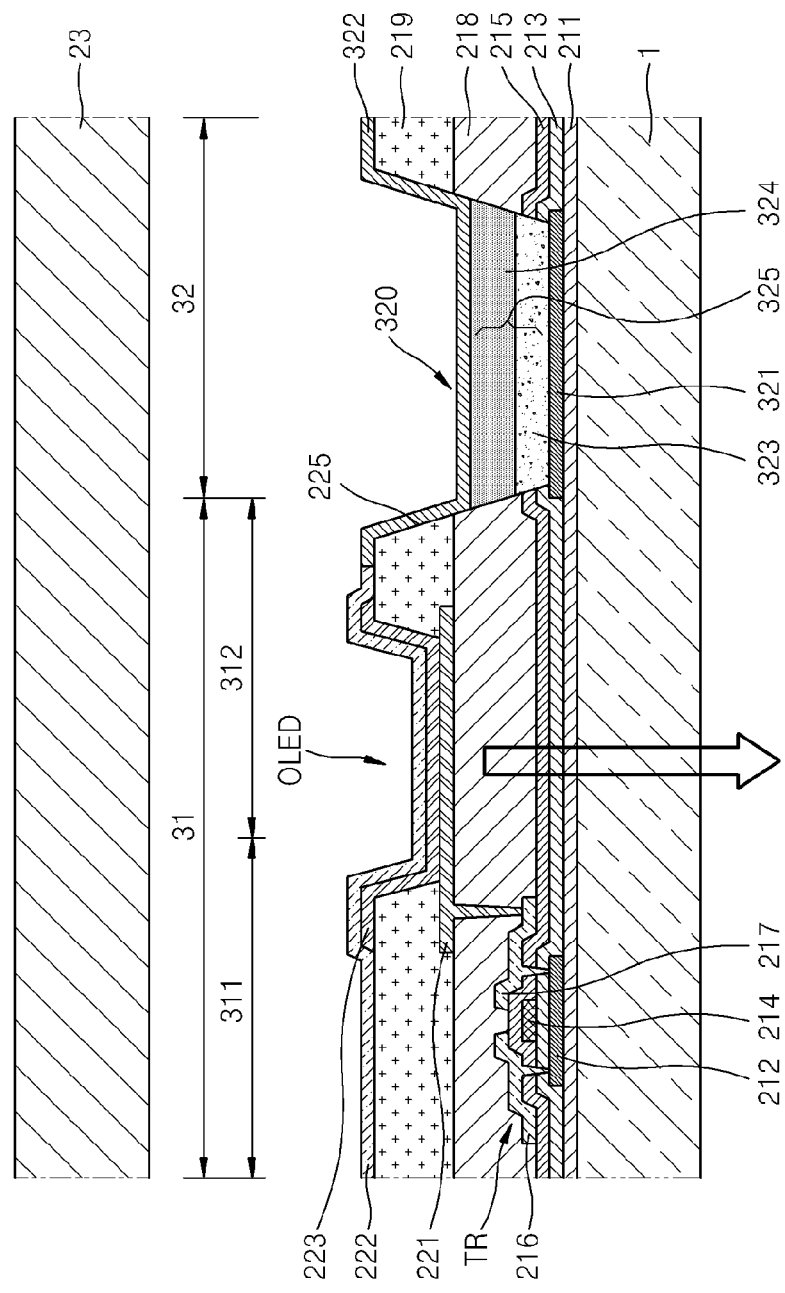

FIG. 10 illustrates an emission mode of the OLED. When the OLED is emitting light, the transmission adjusting device 320 needs to be in a state that does not transmit external light so as to increase visibility of colors that are emitted from the OLED. That is, the second region 32 is covered so that displayed images are not distorted and colors of the image are not unclear due to external light. In order to prevent light from being transmitted through the transmission adjusting device 320, the voltage is applied to the first electrode 221 for driving the OLED, but is not applied to the third electrode 321 for driving the transmission adjusting device 320.

When the voltage is not applied to the third electrode 321, the electric field is not generated between the third and fourth electrodes 321 and 322 and the first solvent 323 is spread on the surface of the third electrode 321 so that the light blocking area is enlarged. Therefore, the transmission adjusting device 320 prevents light from being transmitted therethrough.

Figure 11:
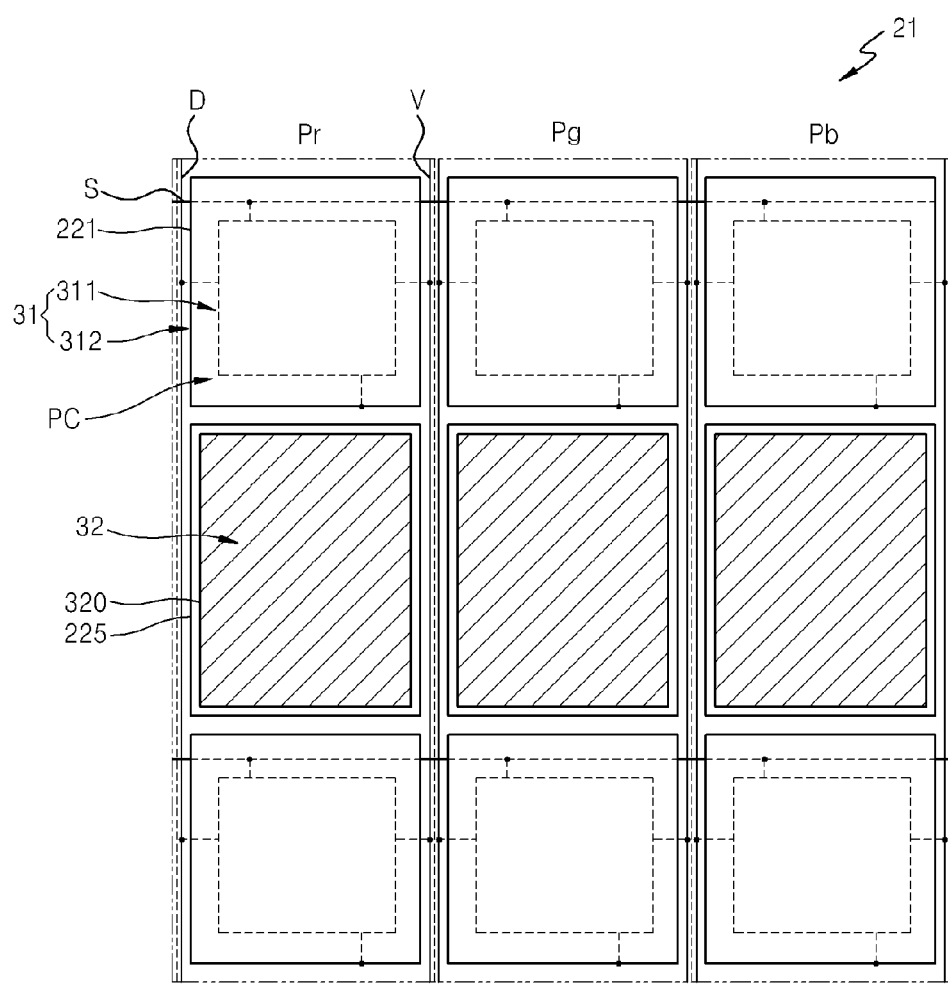
FIG. 11 is a schematic plan view of the organic emission unit of FIG. 4 or 5 according to another embodiment.

FIG. 11 is a plan view of the red, green, and blue pixels Pr, Pg, and Pb of the organic emission unit 21, which are adjacent to each other, according to another embodiment.

The circuit area 311 and the emission area 312 are provided in the first region 31 of each of the red, green, and blue pixels Pr, Pg, and Pb. The circuit area 311 and the emission area 312 are formed such that the circuit area 311 and the emission area 312 overlap each other. According to the embodiment of FIG. 11, the emission area 312 is larger than the pixel circuit PC of the circuit area 311, and thus, the pixel circuit PC of the circuit area 311 is completely covered by the emission area 312.

The second region 32 that transmits external light is formed near the first region 31. As illustrated in FIG. 11, the second region 32 may be separately provided for each of the red, green, and blue pixels Pr, Pg, and Pb.

A plurality of conductive lines such as scan lines S, data lines D, and Vdd lines V are electrically connected to the pixel circuit PC. Although not illustrated in FIG. 11, various conductive lines other than the scan lines S, the data lines D, and the Vdd lines V that are power drivers may be provided depending on configurations of the pixel circuit PC.

Figure 12:
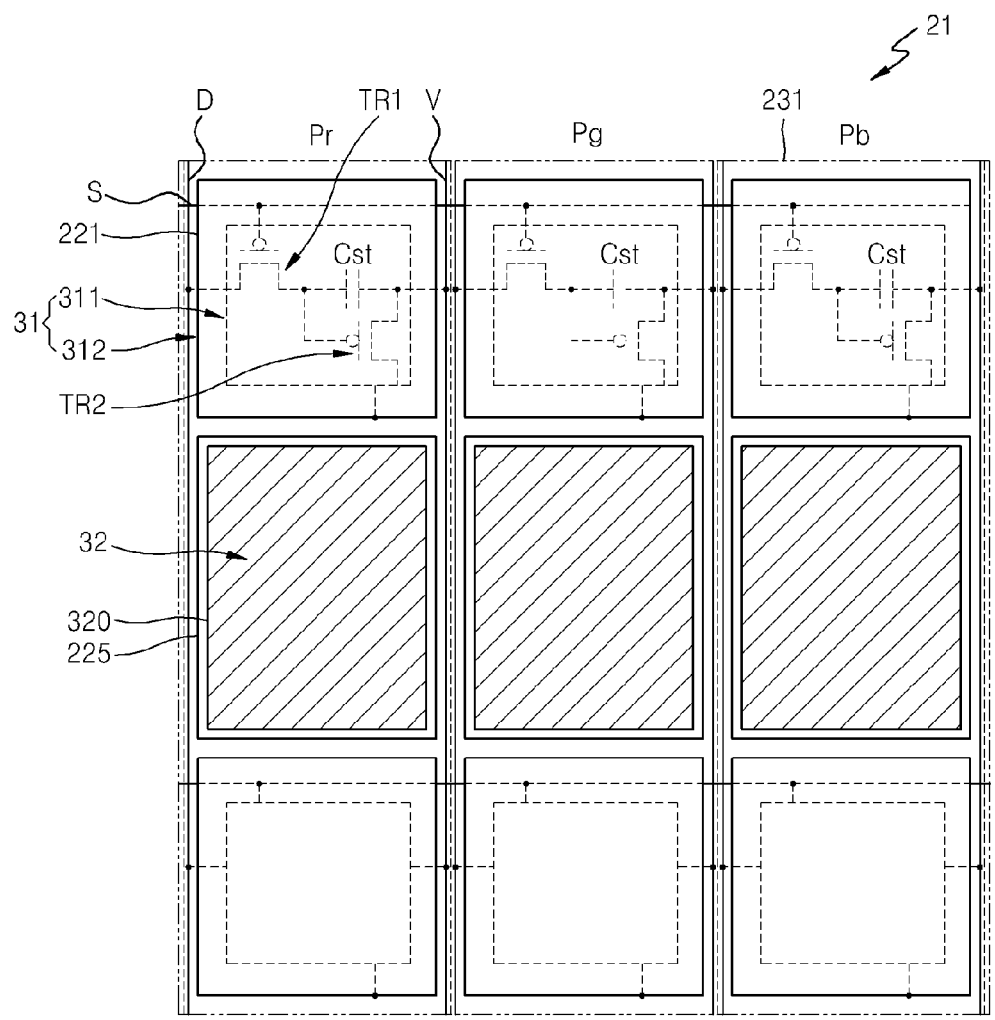
FIG. 12 is a schematic plan view of the organic emission unit including an embodiment of the pixel circuit of FIG. 11.

FIG. 12 is a schematic plan view of a detailed example of the pixel circuit PC of FIG. 11.

As illustrated in FIG. 12, the pixel circuit PC includes a first TFT TR1 connected to the scan lines S and the data lines D, a second TFT TR2 connected to the first TFT TR1 and the Vdd lines V, and a capacitor Cst connected to the first and second TFTs TR1 and TR2. The first TFT TR1 is a switching transistor and the second TFT TR2 is a driving transistor.

The second TFT TR2 is electrically connected to the first electrode 221. In FIG. 12, the first and second TFTs TR1 and TR2 are illustrated as P-type TFTs, but are not limited thereto, and at least one of the first and second TFTs TR1 and TR2 may be N-type TFT. The number of TFTs and capacitors is not limited to the illustrated embodiment. Two or more TFTs and one or more capacitors may be combined to form the pixel circuit PC.

Referring to FIGS. 11 and 12, the scan lines S are formed such that the scan lines S overlap the first electrode 221. However, the described technology is not limited thereto. At least one of the conductive lines including the scan lines S, the data lines D, and the Vdd lines V may overlap the first electrode 221. In some embodiments, all of the conductive lines including the scan lines S, the data lines D, and the Vdd lines V overlap or are formed near the first electrode 221.

According to at least one embodiment, the first and second regions 31 and 32 are separated so that when viewing light through the second region 32, it is possible to prevent image distortion caused due to scattered light reflected off of components included in the pixel circuit PC.

The first and second regions 31 and 32 are formed such that a ratio of the total area of the first and second regions 31 and 32 to the area of the second region 32 is within the range of about 5% and about 90%.

When the ratio of the total area of the first and second regions 31 and 32 to the area of the second region 32 is less than about 5% and the display unit 2 is off as in FIG. 1, the display unit 2 may only transmit a small amount of light, and thus, the user may not be able to view objects or images from the opposite side of the OLED display. That is, the display unit 2 is not transparent. Even when the ratio of the total area of the first and second regions 31 and 32 to the area of the second region 32 is about 5%, since the first region 31 is formed as an island with respect to the second region 32 and conductive patterns are formed in the first region 31 as much as possible to reduce the scattering of sunlight, the user may perceive that the display unit 2 is transparent. In addition, when the TFT in the pixel circuit PC is formed as a transparent TFT such as oxide semiconductor and the OLED is formed by using transparent components, the display unit 2 may be more transparent.

When the ratio of the total area of the first and second regions 31 and 32 to the area of the second region 32 is more than about 90%, the pixel density of the display unit 2 is reduced too far, and thus, it is difficult to form a stable image from light emitted in the first region 31. That is, as the area of the first region 31 decreases, brightness of light emitted from the organic layer 223 described below must be increased to form an image. When the OLED is operated in a high brightness mode, the durability of the OLED is greatly reduced. Also, if a size of the first region 31 is maintained at an appropriate size and the ratio of the total area of the first and second regions 31 and 32 to the area of the second region 32 is greater than about 90%, the size of the first region 31 is reduced and thus, resolution is reduced.

The ratio of the total area of the first and second regions 31 and 32 to the area of the second region 32 may be within a range between about 20% to about 70%.

When the ratio is less than about 20%, since the first region 31 is much larger than the second region 32, the user may not be able to view the images through the second region 32. When the ratio is more than about 70%, there may be a limitation to design of the pixel circuit PC that is to be formed in the first region 31. However, depending on the embodiment, the ratio can be less than about 20% or greater than about 70%.

The first electrode 221 that is electrically connected to the pixel circuit PC is provided in the first region 31 and the pixel circuit PC is overlapped with the first electrode 221 such that the pixel circuit PC is covered by the first electrode 221. Also, at least one of the plurality of conductive lines including the scan lines S, the data lines D and the Vdd lines V may be formed to pass the first electrode 221. Since the probability of the conductive lines reducing the light transmittance is less than the pixel circuit PC reducing transmittance, the conductive lines may all be formed near the first electrode 221, depending on design conditions. As described below, since the first electrode 221 includes a reflective film that is formed by using a conductive metal that may reflect light, the first electrode 221 may block the pixel circuit PC that is overlapped therewith, and prevent the external image from being distorted due to the pixel circuit PC in the first region 31.

Figure 13:
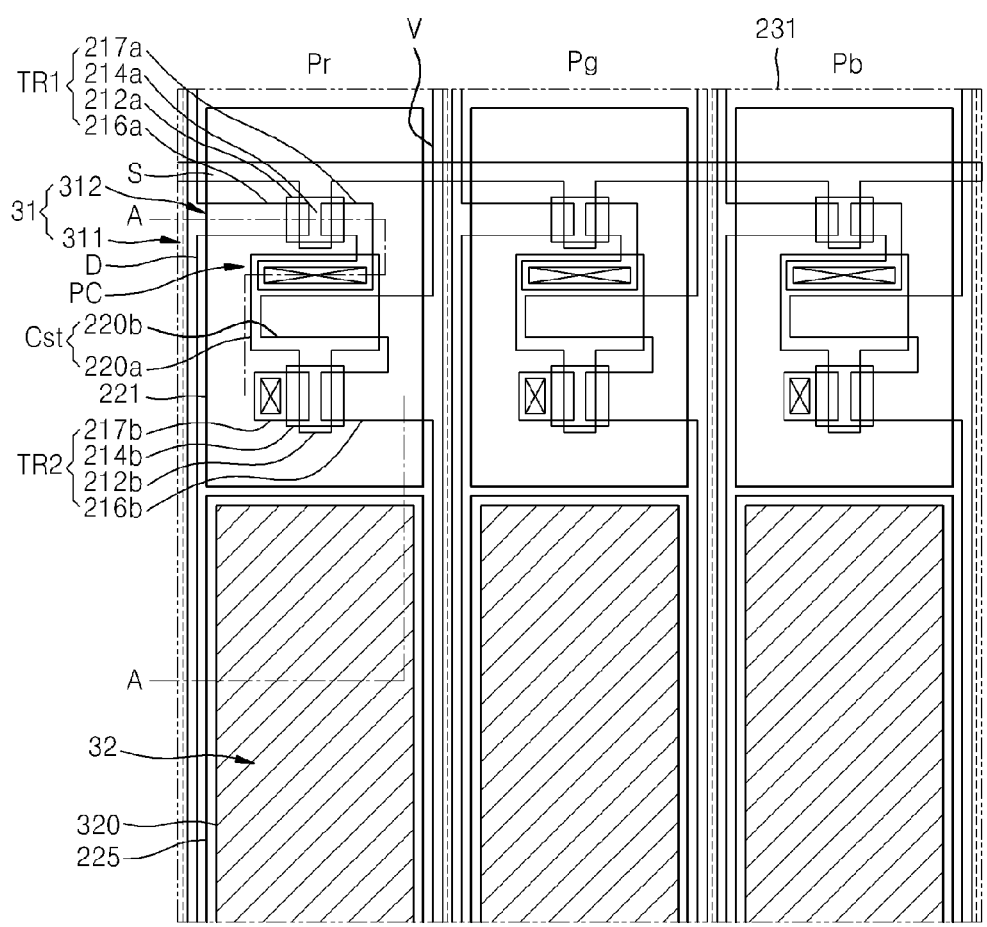
FIG. 13 is a detailed plan view of the organic emission unit of FIG. 12.
Figure 14:
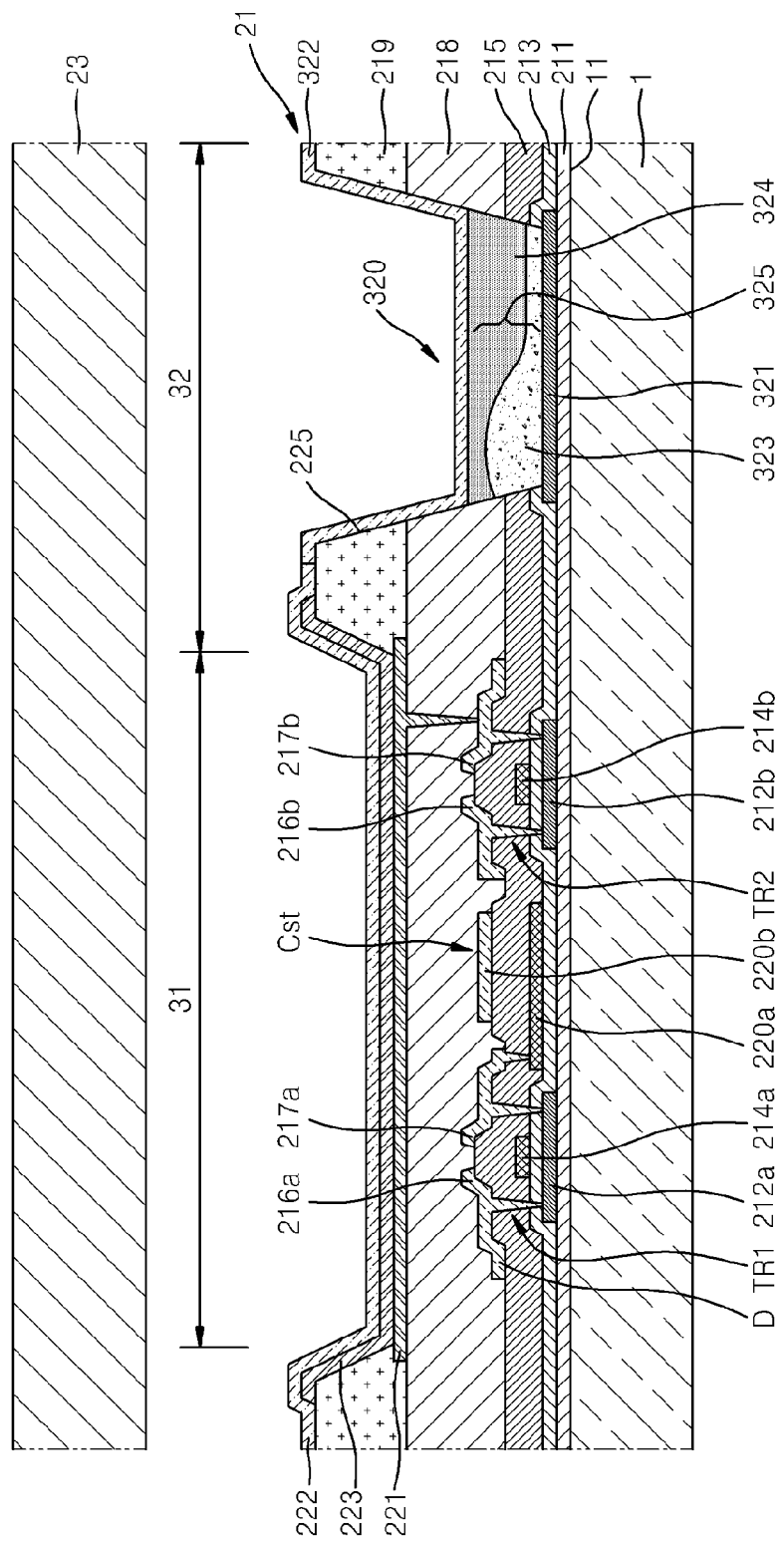
FIG. 14 is a cross-sectional view along the line A-A of the organic emission unit of FIG. 13.

FIG. 13 is a plan view of the organic emission unit 21, according to an embodiment which shows the pixel circuit PC of FIG. 12. FIG. 14 is a cross-sectional view along line A-A of the organic emission unit 21 of FIG. 13.

According to FIGS. 13 and 14, the buffer layer 211 is formed on the first surface 11 of the substrate 1 and the first TFT TR1, the capacitor Cst, and the second TFT TR2 are formed on the buffer layer 211.

A first semiconductor active layer 212a and a second semiconductor active layer 212b are formed on the buffer layer 211.

The first and second semiconductor active layers 212a and 212b may be formed of polycrystalline silicon, but the described technology is not limited thereto, and they may be formed of an oxide semiconductor. For example, the first and second semiconductor active layers 212a and 212b may be I-G-Z—O layers $[(In_2O_3)a(Ga_2O_3)b(ZnO)c$ layers] (where a, b, and c are real numbers that respectively satisfy a≥0, b≥0, and c>0).

The gate insulating layer 213 is formed on the buffer layer 211 to cover the first and second semiconductor active layers 212a and 212b. A first gate electrode 214a and a second gate electrode 214b are formed on the gate insulating layer 213.

The interlayer insulating layer 215 is formed on the gate insulating layer 213 to cover the first and second gate electrodes 214a and 214b. A first source electrode 216a and a first drain electrode 217a and a second source electrode 216b and a second drain electrode 217b are formed on the interlayer insulating layer 215 to respectively contact the first and second semiconductor active layers 212a and 212b via contact holes.

Scan lines S and the first and second gate electrodes 214a and 214b may be simultaneously formed. Data lines D and the first source electrode 216a are simultaneously formed to be connected to the first source electrode 216a and the Vdd lines V and the second source electrode 216b are simultaneously formed to be connected to the second source electrode 216b.

Regarding the capacitor Cst, a lower electrode 220a and the first and second gate electrodes 214a and 214b are simultaneously formed and an upper electrode 220b and the first drain electrode 217a are also simultaneously formed.

Respective structures of the first TFT TR1, the capacitor Cst, and the second TFT TR2 are not limited to the above description. Various TFTs and capacitors may be used as the first TFT TR1, the capacitor Cst, and the second TFT TR2. For example, the first and second TFTs TR1 and TR2 may be top gate or bottom gate type TFTs in which the first and second gate electrodes 214a and 214b are respectively formed below the first and second semiconductor active layers 212a and 212b. Other TFTs may be used as the first and second TFTs TR1 and TR2.

The passivation layer 218 is formed to cover the first TFT TR1, the capacitor Cst, and the second TFT TR2. The passivation layer 218 may be a single insulating layer or a plurality of insulating layers having a planarized top surface. The passivation layer 218 may be formed of an inorganic and/or organic material.

As illustrated in FIGS. 13 and 14, the first electrode 221 is formed on the passivation layer 218 to cover the first TFT TR1, the capacitor Cst, and the second TFT TR2. The first electrode 221 is connected to the second drain electrode 217b of the second TFT TR2 through a via hole formed in the passivation layer 218. As illustrated in FIG. 13, the first electrode 221 is formed as an independent island in each pixel.

The PDL 219 is formed on the passivation layer 218 to cover the edge of the first electrode 221.

The organic layer 223 and the second electrode 222 are sequentially stacked on the first electrode 221. The second electrode 222 is formed over the first region 31 and the second region 32.

The first electrode 221 may function as an anode electrode, and the second electrode 222 may function as a cathode electrode, or vice versa.

The first electrode 221 is formed in each pixel such that a size of the first electrode 221 corresponds to the first region 31. The second electrode 222 may be formed as a common electrode so that all pixels of the organic emission unit 21 are covered.

According to some embodiments, the first electrode 221 is a reflective electrode and the second electrode 222 is a semi-transparent electrode. In these embodiments, the organic emission unit 21 is of a top emission type in which an image is formed toward the second electrode 222.

Accordingly, the first electrode 221 may include a reflective film formed of Ag, Mg, Al, Pt, Pd, Au, Ni, Nd, Jr, Cr, Li, Ca, or a compound thereof, and ITO, IZO, ZnO, or $In_2O_3$ having a low work function. The second electrode 222 may be formed of metal having a low work function, that is, Ag, Mg, Al, Pt, Pd, Au, Ni, Nd, Ir, Cr, Li, Ca, or an alloy thereof. The second electrode 222 may be formed as a thin film so that light transmittance is high.

When the first electrode 221 is a reflective electrode, the pixel circuit PC is covered by the first electrode 221. Therefore, referring to FIG. 14, the user may not view from an upper exterior side of the second electrode 222 the respective patterns of the first TFT TR1, the capacitor Cst, and the second TFT TR2 formed below the first electrode 221, and a portion of the scan lines S, the data lines D, and the Vdd lines V.

When the first electrode 221 is a reflective electrode, light is emitted only toward a viewer, that is, an upper side. Thus, the amount of light that is lost in an opposite direction of the viewer may be reduced. Also, as described above, since the first electrode 221 may cover various patterns of the pixel circuit PC that is formed under the first electrode 221, the viewer may see a transmitted image more clearly.

The passivation layer 218, the gate insulating layer 213, the interlayer insulating layer 215, and the PDL 219 may be transparent insulating layers.

According to the embodiment of FIGS. 13 and 14, the transmission window 225 is formed in at least one of the PDL 219, the passivation layer 218, the interlayer insulating layer 215, the gate insulating layer 213, and the buffer layer 211. The transmission window 225 may be formed by removing the portions of the interlayer insulating layer 215 and the gate insulating layer 213 that correspond to the second region 32. Two or more transmission windows 225 may be formed to overlap each other.

The transmission window 225 may be formed as an island pattern. As illustrated in FIG. 14, the transmission window 225 may be separately provided for each of the red, green, and blue pixels Pr, Pg, and Pb.

According to the embodiment illustrated in FIGS. 11 to 13, the transmission adjusting device 320 is provided in the second region 32. The transmission adjusting device 320 includes the third and fourth electrodes 321 and 322, which face each other, and solvents provided between the third and fourth electrodes 321 and 322.

The third electrode 321 is provided in the second region 32. Referring to FIG. 14, the third electrode 321 is provided on the buffer layer 211 and the transmission window 225 is provided such that the gate insulating layer 213, the interlayer insulating layer 215, the passivation layer 218, and the PDL 219 cover the edge of the third electrode 321 and expose the center of the third electrode 321. However, the described technology is not limited thereto. The third electrode 321 may be provided at various locations depending on the location of the transmission window 225.

The third electrode 321 is a transparent electrode. For example, the third electrode 321 may be formed of a transparent conductive oxide material, such as ITO, IZO, ZnO, or $In_2O_3$. The transmission adjusting device 320 needs to have a high light transmittance so as to be capable of adjusting the external light transmittance over as large a range as possible. Accordingly, the third electrode 321 is formed of a transparent material having a high light transmittance.

The third electrode 321 may be formed as an island that is separated and independent in each pixel, but is not limited thereto, and may be disposed above and connected to all pixels. When the third electrode 321 is disposed above and connected to all pixels, the third electrode 321 may be a line electrode that traverses the second region 32 of the pixels that are located in a single row. When the third electrode 321 is formed as an island, a switching TFT or a bridge electrode may be connected to each of the third electrode 321. The third electrode 321 may receive a voltage or a signal for turning on/off the transmission adjusting device 320, directly or via the switching TFT or the bridge electrode. A voltage or a signal that is applied to the first electrode 221 is not the same as a voltage or signal applied to the third electrode 321.

The fourth electrode 322 is provided to face the third electrode 321. The fourth electrode 322 is provided such that the cavity 325 of a predetermined size is formed between the third and the fourth electrodes 321 and 322. The fourth electrode 322 is formed above and connected to a plurality of pixels and may be connected to the second electrode 222. That is, in some embodiments, the fourth electrode 322 is integrally formed with the second electrode 222, and thus, the fourth electrode 322 may be part of the second electrode 222. In these embodiments, the fourth electrode 322 is formed integrally for all of the transmission adjusting devices 320. That is, the fourth electrode 322 may be formed as a thin film metal layer using Ag, Mg, Al, Pt, Pd, Au, Ni, Nd, Jr, Cr, Li, or Ca.

The first and second solvents 323 and 324 may be provided in the cavity 325 that is formed between the third and fourth electrodes 321 and 322. The first solvent 323 is a solvent that blocks light and the light blocking area thereof is adjusted according to an electric field applied thereto. That is, the first solvent 323 is a solvent that has an electrowetting property and a contact angle thereof that is formed with respect to the third electrode 321 changes according to the electric field applied thereto. For example, the first solvent 323 may be black oil, but is not limited thereto, and may be a solvent having a unique color, or a solvent including particles such as carbon (C) or titanium oxide ($TiO_2$) which may block light.

The second solvent 324 may be formed of a material that is not mixed with the first solvent 323. For example, if the first solvent 323 is hydrophobic, the second solvent 324 may be hydrophilic. As another example, if the first solvent 323 is non-polarized, the second solvent 324 may be polarized. The second solvent 324 may fill the cavity 325 formed between the third and fourth electrodes 321 and 322 so that the cavity 325 is maintained.

When an electric field is not applied between the third and fourth electrodes 321 and 322, the first solvent 323 spreads and contacts a large area of the surface of the third electrode 321. That is, the first solvent 323 has a low contact angle with respect to the surface of the third electrode 321. However, when an electric field is applied between the third and fourth electrodes 321 and 322, the first solvent 323 contracts, and thus, the first solvent 323 may contact a small area of the surface of the third electrode 321. That is, the first solvent 323 has a high contact angle with respect to the surface of the third electrode 321. Therefore, when the electric field is not applied between the third and fourth electrodes 321 and 322, the first solvent 323 has the largest light blocking area, and thus, blocks light from being transmitted through the second region 32. When the electric field is applied between the third and fourth electrodes 321 and 322, the first solvent 323 has the smallest light blocking area, and thus, allows light to be transmitted through the second region 32.

Figure 15:
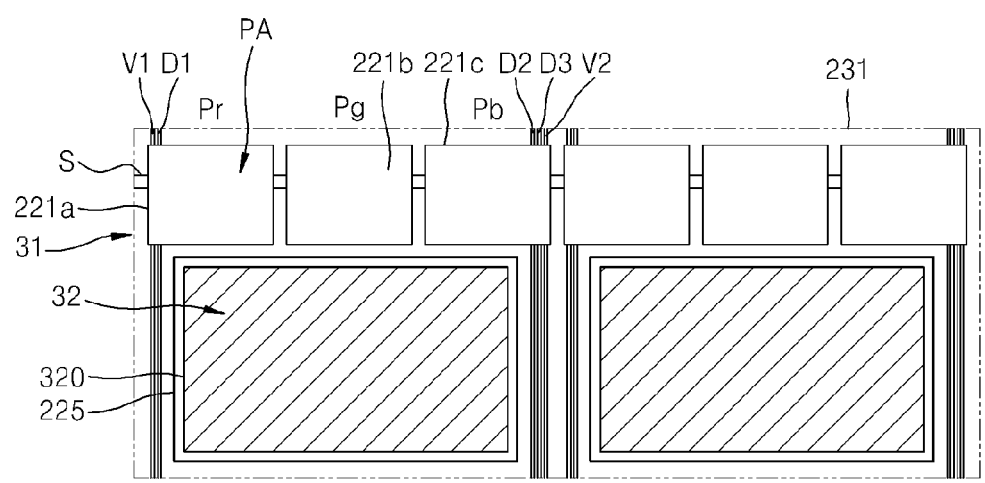
FIG. 15 is a schematic plan view of the organic emission unit of FIG. 4 or 5 according to another embodiment.

FIG. 15 is a schematic plan view of the organic emission unit 21, according to another embodiment. A first electrode 221*a* of the red pixel Pr, a first electrode 221*b* of the green pixel Pg, and a first electrode 221*c* of the blue pixel Pb are formed to correspond to one second region 32. A first data line D1, a second data line D2, and a third data line D3 are respectively connected to the first electrodes 221*a*, 221*b*, and 221*c* of the red, green, and blue pixels Pr, Pg, and Pb. In addition, a first Vdd line V1 is electrically connected to the first electrodes 221*a* and 221*b* of the red and green pixels Pr and Pg and a second Vdd line V2 is electrically connected to the first electrode 221*c* of the blue pixel Pb.

In the structure described above, a single large second region, i.e., the second region 32, is provided for three pixels, for example, the red (R), green (G), and blue (B) pixels. Thus, the light transmittance may be further increased and image distortion that is caused by light scattering may be further reduced.

The transmission window 225 is formed in insulating layers that are disposed at a location that corresponds to a location of the second region 32 and the transmission adjusting device 320 is provided in the transmission window 225. Thus, the light transmittance of the OLED display may be adjusted. In particular, when the OLED display emits light, external light is not transmitted through the second region 32, and thus, the colors and images can be displayed more clearly.

As described above, according to at least one embodiment, the OLED display can control light transmittance therethrough.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. An organic light-emitting diode (OLED) display, comprising:
    at least one pixel including a first region that emits light and a second region configured to selectively transmit external light received from one side of the OLED display so as to be emitted from an opposing side of the OLED display;
    at least one thin film transistor (TFT) formed in the first region of the pixel;
    an insulating layer formed over the TFT;
    at least one first electrode formed in the first region of the pixel over the insulating layer;
    at least one organic layer formed over the first electrode;
    a second electrode formed over the organic layer;
    at least one third electrode corresponding to the pixel, wherein the third electrode is formed in the second region of the pixel;
    at least one solvent placed over the third electrode, wherein the solvent selectively blocks the external light from being transmitted through the OLED display based at least in part on an electric field; and
    a fourth electrode formed over the solvent,
    wherein a transmission opening is formed in the insulating layer in the second region of the pixel,
    wherein the solvent is placed in the transmission opening,
    wherein the at least one TFT comprises i) an active layer and ii) a gate electrode insulated from the active layer, and
    wherein the at least one third electrode is disposed on a same layer as the active layer.

2. The OLED display of claim 1, wherein the first electrode is a light reflecting electrode and the third electrode is a light transmitting electrode.

3. The OLED display of claim 1, wherein the first region of the pixel comprises i) a circuit including the TFT and ii) an emission area including the first electrode and wherein the circuit region and the emission area substantially overlap each other.

4. The OLED display of claim 2, wherein the fourth and second electrodes are integrally formed.

5. The OLED display of claim 1, wherein the first and third electrodes are light transmitting electrodes.

6. The OLED display of claim 1, wherein the first region of the pixel comprises i) a circuit including the TFT and ii) an emission area including the first electrode and wherein the circuit region and the emission area are adjacent to each other.

7. The OLED display of claim 5, wherein the fourth and second electrodes are separately formed.

8. The OLED display of claim 1, wherein the OLED display is further configured to respectively generate electric fields i) between the first and second electrodes and ii) between the third and fourth electrodes, wherein when the OLED display generates the electric field between the first and second electrodes, the OLED display does not generate the electric field between the third and fourth electrodes and wherein when the OLED display does not generate the electric field between the first and second electrodes, the OLED display generates the electric field between the third and fourth electrodes.

9. The OLED display of claim 8, wherein when the electric field is not generated between the third and fourth electrodes, a light blocking area of the solvent is at a maximum and when the electric field is generated by the third and fourth electrodes, the light blocking area of the solvent is at a minimum.

10. The OLED display of claim 1, wherein the solvent comprises black oil.

11. The OLED display of claim 10, wherein a surface of the third electrode and a surface of the fourth electrode which contact the black oil are hydrophobic.

12. The OLED display of claim 1, wherein the at least one pixel includes a plurality of pixels.

13. The OLED display of claim 12, wherein the second electrode and the fourth electrode formed over the solvent for all of the pixels.

14. The OLED display of claim 12, wherein each of the third electrodes corresponds to one of the pixels.

15. The OLED display of claim 12, wherein each of the third electrodes corresponds to at least two adjacent pixels.

16. An organic light-emitting diode (OLED) display, comprising:
   at least one pixel including a first region that emits light and a second region configured to selectively transmit external light received from one side of the OLED display so as to be emitted from an opposing side of the OLED display;
   at least one first electrode formed in the first region of the pixel;
   at least one organic layer formed over the first electrode;
   a second electrode formed over the organic layer;
   at least one third electrode corresponding to the pixel, wherein the third electrode is formed in the second region of the pixel;
   at least one solvent placed over the third electrode in the second region, wherein the solvent selectively blocks the external light from being transmitted through the OLED display based at least in part on an electric field;
   a fourth electrode formed over the at least one solvent;
   a gate insulating layer;
   an interlayer insulating layer formed over the gate insulating layer;
   a passivation layer formed over the interlayer insulating layer; and
   a pixel defining layer formed over the passivation layer,
   wherein a transmission opening is formed in each of the gate insulating layer, the interlayer insulating layer, the passivation layer, and the pixel defining layer in the second region of the pixel, and
   wherein the at least one solvent is placed in the transmission opening.

* * * * *